United States Patent [19]

Yamashita et al.

[11] E Patent Number: Re. 32,605

[45] Reissued Date of Patent: Feb. 16, 1988

[54] FREQUENCY DIVIDER

[75] Inventors: Kiichi Yamashita, Kanagawa; Junichi Nakagawa, Tokorozawa; Tadao Kaji, Hinode, all of Japan

[73] Assignee: Hitachi, Ltd., Tokyo, Japan

[21] Appl. No.: 749,717

[22] Filed: Jun. 28, 1985

Related U.S. Patent Documents

Reissue of:

[64] Patent No.: 4,390,960
Issued: Jun. 28, 1983
Appl. No.: 209,112
Filed: Nov. 21, 1980

[30] Foreign Application Priority Data

Nov. 21, 1979 [JP] Japan ..... 54-150083

[51] Int. Cl.[4] ..... H03K 21/38; H03K 23/48

[52] U.S. Cl. ..... 377/47; 377/54; 377/108; 377/110; 364/703

[58] Field of Search ..... 377/47, 48, 54, 72, 377/73, 108, 110; 328/15, 25, 30, 16; 364/703

[56] References Cited

U.S. PATENT DOCUMENTS

| | | | |
|---|---|---|---|
| 3,230,352 | 1/1966 | Grondin et al. | 377/44 |
| 3,426,180 | 2/1969 | Smith | 377/36 |
| 3,673,501 | 6/1972 | Zeph | 377/70 |
| 3,818,242 | 6/1974 | Freedman | 377/72 |
| 3,978,413 | 8/1976 | Frohwerk | 377/72 |
| 3,987,313 | 10/1976 | Pfleiderer | 377/62 |
| 4,053,739 | 10/1977 | Miller et al. | 377/47 |
| 4,184,068 | 1/1980 | Washburn | 377/47 |
| 4,234,849 | 11/1980 | Crilly, Jr. | 377/110 |
| 4,264,863 | 4/1981 | Kojima | 377/110 |

*Primary Examiner*—John S. Heyman
*Attorney, Agent, or Firm*—Antonelli, Terry & Wands

[57] ABSTRACT

In utilizing frequency dividers at high frequencies the maximum operating frequency is determined by the delay time through the frequency divider. To minimize this delay time, a digital frequency divider is provided having a binary counter constructed of flip-flops and a shift register coupled to the output of said counter, wherein the output state of the shift register is forcibly reduced to a low level in response to a control signal for varying the number of frequency division of said counter. A circuit is also provided for feeding the input terminal of the flip-flop at the first stage of said counter with an OR output made up of the outputs of said shift register and said counter. Thus, the digital frequency divider can operate at a speed which is limited only by the toggle frequency of said flip-flop circuits.

30 Claims, 8 Drawing Figures

FREQUENCY DIVIDER

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a frequency divider, and, more particularly, to a 2-modulus prescaler which is constructed of a digital circuit so that it can operate at a high speed.

2. Background of the Invention

The digitalization of an RF circuit to be used in a TV receiver, an FM receiver or a mobile telephone has recently been performed. Of these, the development of the frequency synthesizer which operates at radio frequencies in the VHF and UHF bands has been promoted. One of the important parts of such a circuit is a frequency divider which can count down the frequency.

An important consideration for the development of a digital frequency divider is that the division ratio can be varied in accordance with its intended use, i.e., that it can be programmed. Also, it is important that the divider can operate at a high speed and that its production yield is so high that it can be constructed at a low cost.

The digital frequency divider is preferably constructed with a pulse counter using a number of flip-flop circuits. But the construction of the flip-flop circuit operating at a GHz band raises a number of problems in the careful selection of the circuit constituting elements and in the design and production of the device.

As the frequency divider which can operate at a high speed and which can be programmed, the so-called "Swallow-count" frequency divider has conventionally been used. This device is constructed of high and low speed units in which the 2-modulus prescaler developed as the Swallow-count frequency divider is used in the high speed unit. This 2-modulus prescaler can have its number of frequency division (or mode) interchanged in two (or more) stages in response to an external control signal and is used in combination with another programmable (or frequency division number variable) frequency divider which can operate at a low speed.

The Swallow-count frequency divider is, in principle, a variable frequency divider belonging to that class of divider having high operating speeds. However, even so, the device practically has its upper operating limit at 650 MHz at the present time. In case, however, the frequency divider is to be used in a mobile telephone or a UHF TV receiver, there is required a frequency divider which operates at a frequency equal to or higher than about 1 GHz. This requirement has not been satisfied by the conventional frequency divider. Therefore, the realization for the digital frequency divider which can operate at a frequency as high as 1 GHz or more has been desired.

SUMMARY OF THE INVENTION

It is therefore an object of the present invention to improve the conventional 2-modulus prescaler and to provide a digital frequency divider which can operate at a high speed. More specifically, the object of the present invention is to provide a digital frequency divider which has its operating speed (as high as 1 GHz) substantially determined only by the delay time of one stage of a flip-flop circuit constituting the digital frequency divider.

In order to attain the aforementioned object, the present invention is characterized in that the 2-modulus prescaler is constructed in the following manner. Namely, the 2-modulus prescaler is constructed to include a binary counter which is constructed of a flip-flop circuit and a shift register having an input terminal connected with the output terminal of said frequency divider, a terminal having its output state forcibly reduced to a "0" level in response to an external control signal, and an output terminal. An OR gate feeds the input terminal of the flip-flop at the first stage of said frequency divider with [the OR (or NOR)] *the logical operation signal (OR or NOR signal)* signal between the signal at the output terminal of said frequency divider and the signal at the output terminal of said shift register. Thus, a frequency-divided output is generated at the output terminal of said frequency divider.

In other words, the 2-modulus prescaler according to the present invention is characterized in that the binary counter is controlled by the output signal of the shift register for shifting the output thereof and in that the mode change is performed whether or not the shift register is cleared.

According to the present invention, the operating speed of the prescaler becomes substantially equal to the toggle operating speed of the first-stage flip-flop circuit constituting the binary counter thereby to make it possible to provide a prescaler which has an operating speed as high as 1 GHz in the existing process.

The operating principles thus far described and the other objects and characteristics of the present invention will become more apparent from the following description made in conjunction with the accompanying drawings.

DESCRIPTION OF THE PREFERRED EMBODIMENTS

First of all, in order to facilitate the understanding of the present invention, the "Swallow-count" frequency divider of which the frequency divider according to the present invention is mainly used will be described together with the factors determining the operating speed of that frequency divider.

Figure 1:
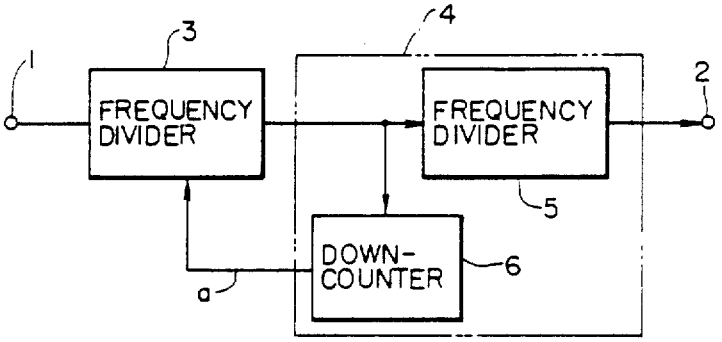
FIG. 1 PRIOR ART
FIG. 1 shows the general construction of the "Swallow-count" frequency divider.

FIG. 1 shows the construction of the "Swallow-count" frequency divider. This frequency divider is well known in the art so that its operating principles will now be briefly described. An input signal (e.g., a clock signal) to be divided is fed from an input terminal 1 to a 2-modulus frequency divider 3 constituting a high speed operating unit. The 2-modulus frequency divider 3 has two operating modes of frequency division numbers n and n+1 (wherein n is an integer) and interchanges its two operating modes in response to an external control signal a coming from a low speed operating unit 4. The output of the aforementioned frequency divider 3 is fed to another frequency divider 5 and a down-counter 6. Here, for convenience, the number of the frequency division of the frequency divider 5 is [denoted at] *defined as* K (which is an integer), and the frequency division number of the down-counter 6 is [denoted at] *defined as* A (which is also an integer). Now, while the down-counter 6 is first counting the A output pulses of the frequency divider 3, the control signal a is generated, and the frequency division number of the frequency divider 3 is made n+1. Then, after the down-counter 6 has counted the A pulses, the mode of the frequency divider 3 is interchanged to n, and the remaining pulses are counted by the frequency divider 5. After the counting operation of the (K−A) pulses, the mode of the frequency divider 3 is interchanged again to n+1. These operations are repeated. Therefore, the whole frequency division number N is expressed by the following Equation:

$$N=(K-A)n+A(n+1)=nK'A.$$

Thus, by setting the aforementioned integers n, K and A, any desired frequency division number can be set. The determinant of the operating speed of the aforementioned frequency divider is the 2-modulus frequency divider 3 which is to be fed with the highest clock rate signal among the aforementioned circuits. Therefore, for the construction of a variable frequency divider in the UHF band, the development of the 2-modulus frequency divider 3 is indispensable.

Figure 2:
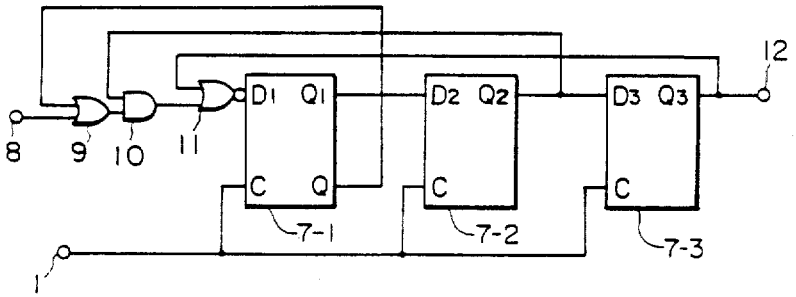
FIG. 2 PRIOR ART
FIGS. 2 and 3B are circuit diagrams showing the conventional frequency dividers.

FIG. 2 is a circuit diagram showing the 2-modulus frequency divider having the frequency division numbers of 5 and 6, which is representative of conventional frequency dividers. In FIG. 2: reference numerals 7-1, 7-2 and 7-3 indicate D-type flip-flop circuits; numerals 9 and 11 indicate an OR gate and a NOR gate, respectively; numeral 10 indicates an AND gate; and numerals 1, 8 and 12 indicate the input terminal of the clock signal, the input terminal of the mode change signal, and the output terminal, respectively. As is well known, such D-type flip-flops provide an output at their Q terminals in accordance with the existing input at their D terminals at the instant a clock pulse is applied to their C terminal.

TABLE 1

COUNT SEQUENCE TABLE

| $Q_1$ | $Q_2$ | $Q_3$ |
|---|---|---|
| H | H | H |
| L | H | H |
| L | L | H |
| L | L | L |
| H | L | L |
| H | H | L |

1/5 1/6

H: High Level
L: Low Level

Table 1 is a count sequence table illustrating the operations of the aforementioned frequency divider. In this Table: reference letters $Q_1$, $Q_2$ and $Q_3$ indicate the respective outputs of the flip-flop circuits 7-1, 7-2 and 7-3; letter H indicates a high level (corresponding to the logic value "1"); and letter L indicates a low level (corresponding to the logic value "0"). The operations for this count sequence table will be shortly described in the following discussion.

First of all, let it be assumed that the output states of the respective flip-flop circuits are at the high level and that the mode change signal is at the low level. If the clock signal is supplied at this state, since the H of the output signal $Q_3$ is inverted by the NOR circuit 11, the input $D_1$ of the flip-flop circuit 7-1 is at the low level L so that the output signal $Q_1$ takes the low level L. At this time, since the respective flip-flop circuits are at the synchronous state (in which the respective clock terminals are commonly fed with the clock signal), the states of the output signals $Q_1$ and $Q_2$ are simultaneously shifted in the flip-flops 7-2 and 7-3, respectively, so that transit takes place to the state [LHH] of the second column of the aforementioned Table 1. As the clock signal continues to be fed, the transit of the state arrives at [LLH] and [LLL]. In the course of proceeding to this state [of LLL], irrespective of the outputs of the OR gate 9 and the AND gate 10, the input $D_1$ of the flip-flop circuit 7-1 is always at the low level because of the high level of $Q_3$ being fed to the NOR circuit 11 which inverts this high level $Q_3$ signal to a low level. At the state [LLL], however, the outputs of the gate circuits 9 and 10 are reduced to the low level so that the output $Q_3$ does not take the high level until it is inverted by the NOR circuit 11. As a result, the states [HLL] and [HHL] are next taken in response to the succeeding clock pulses until finally the initial state [HHH] is restored. Specifically, since the same state is repeated each time the six clock pulses are fed, the signal (having its frequency divided) having a 1/6 frequency of the clock signal is generated at the output terminal 12.

Now, if the mode change signal is at the high level at the final state [HHL], the outputs of the OR circuit 9 and the AND circuit 10 take the high level so that the input $D_1$ of the flip-flop circuit 7-1 is forced to take the low level. As a result, in response to the subsequent clock pulse, the state becomes [LHH], which is the initial state. After that, the frequency division of 1/5 is carried out by the operations similar to those of the case of the frequency division number described above.

Now, the operating speed of the frequency divider thus far described will be taken into consideration.

Such 2-modulus frequency divider requires the use of logic circuits such as the OR and AND circuits 9 and 10 in addition to the flip-flop circuits. In the aforementioned example, since the NOR circuit 11 can be constructed by combining the wired OR circuit and the D input and since the OR circuit 9 can be constructed of the wired OR circuit, influence upon the operating speed is little and can be ignored. However, unlike an OR circuit, it is difficult to realize the AND circuit with the use of other means without decelerating the operating speed. As a result, the operating speed of the conventional 2-modulus frequency divider has to take the delay time of the AND circuit into consideration so that it is determined by the summation of the delay time of that AND circuit and the delay time of the first stage flip-flop circuit. More specifically, if the delay time of the flip-flop circuit is denoted at $\tau_F$ and if the delay time of the AND circuit is denoted at $\tau_A$, the operating frequency of the 2-modulus frequency divider reaches a value of about $1/(\tau_A+\tau_F)$ at the maximum.

In the 2-modulus frequency divider according to the present invention, the maximum operating speed is set at $1/\tau_F$ if it is expressed in terms of frequency.

Figure 3A:
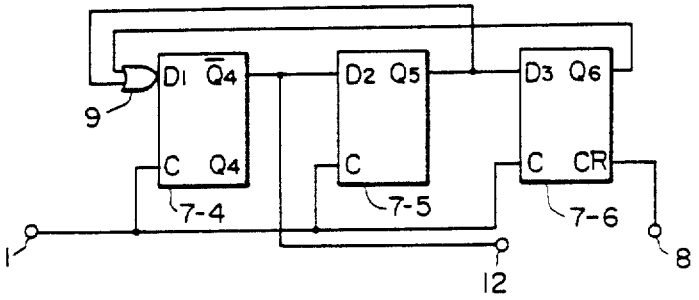
FIGS. 3A, 5 and 7 are circuit diagrams showing frequency dividers according to embodiments of the present invention.
Figure 3B:
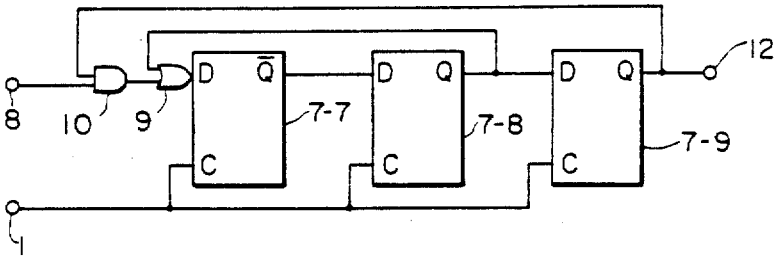
FIG. 3B PRIOR ART

FIG. 3A is a circuit diagram showing one embodiment of the 2-modulus frequency divider according to the present invention, which is so constructed that the frequency division number can be interchanged between 4 and 5. Incidentally, in order to clarify the difference between the present invention and the prior art, the frequency divider having the same frequency division number and constructed according to the prior art is shown in FIG. 3B.

In FIG. 3A, D-type flip-flop circuits 7-4 and 7-5 constitute a binary counter, and a flip-flop circuit 7-6 with a clear terminal CR is a shift register which has both a switching function and the operating function of the flip-flop circuit. This flip-flop circuit 7-6 is so constructed that [the clear, i.e., the low level, is forcibly generated] *the signal level in the output terminal $Q_6$ is forced low* only when the clear signal from the input terminal of the control signal is at the high level. The clock terminals C of the respective flip-flop circuits are commonly fed with the clock signal from the input terminal 1 (or are synchronized with one another). The flip-flop output of the preceding stage is connected with the input terminal of the flip-flop circuit of the next stage so that the first flip-flop circuit 7-4 has its input terminal $D_1$ fed with the output signals of the output terminals $Q_5$ and $Q_6$ of the flip-flop circuits 7-5 and 7-6 through an OR circuit (which is constructed of the wired OR gate). And, the signal, which has its frequency divided from the output terminal $\overline{Q}_4$ of the flip-flop 7-4 of the binary counter, is extracted through the output terminal 12.

In the present embodiment, the shift register, i.e., the flip-flop 7-6 is a portion forming the characteristics of the frequency divider according to the present invention. The operations of the frequency divider according to the present embodiment will be described in the following.

TABLE 2

| $Q_4$ | $Q_5$ | $Q_6$ |
|---|---|---|
| H | L | L |
| L | L | L |
| L | H | L |
| H | H | H |
| H | L | H |

1/4 1/5

Table 2 is a count sequence table illustrating the operations of the aforementioned 2-modulus frequency divider.

Figure 4:
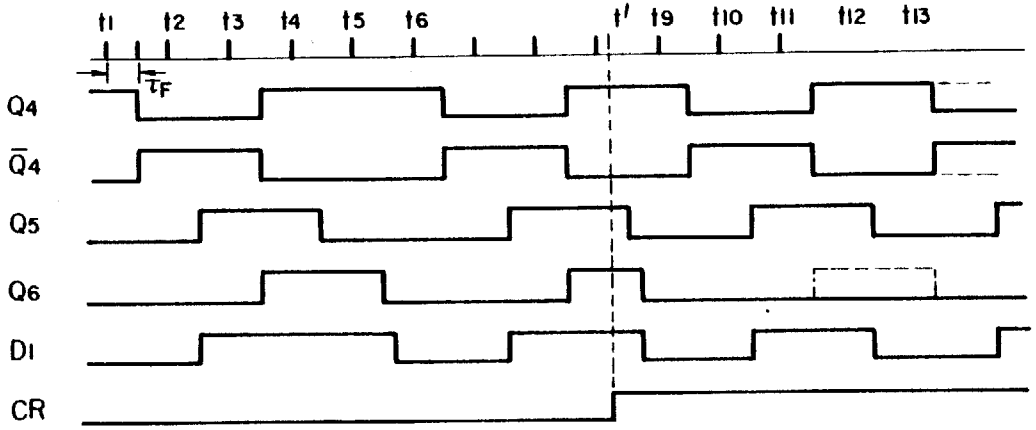
FIGS. 4 and 6 are time charts for illustrating the operations of the frequency dividers shown in FIGS. 3A and 5.

FIG. 4 is a time chart illustrating the states of the signals of the respective parts of FIG. 3A for explaining the operations thereof.

First of all, referring to FIG. 3A and FIG. 4, let it be assumed that the states of the outputs $Q_4$, $Q_5$ and $Q_6$ of the respective flip-flop circuits are at [HLL]. Here, in the circuit of FIG. 3A, the output terminal of the flip-flop circuit 7-4 is the not-output signal $\overline{Q}_4$. As a result, the inputs D of the respective flip-flop circuits 7-4, 7-5 and 7-6 at the instant when the clock signal is fed are at the state [LLL], which is held after the feed of the clock signal. Likewise, when the clock signals at the instants $t_2$, $t_3$ and $t_4$ are fed to the clock terminals C of the respective flip-flop circuits, the transit of the state takes place to [LHL], [HHH] and [HLH] until the initial state [HLL] is restored at the next instant $t_5$. Thus, the same state is repeated during the period of the five clock signals thereby to accomplish the 1/5 frequency division.

Now, if the clear terminal CR of the flip-flop circuit (i.e., the shift register) 7-6 is fed with the mode change signal so that it is raised to the high level, the flip-flop 7-6 is cleared to have its output terminal $Q_6$ at the low level. After that, the output terminal $Q_6$ is always at the low level so that the states of the output terminals $Q_4$ and $Q_5$ become [LL], [LH], [HH] and [HL], respectively, in a manner to correspond to clock signals $t_9$, $t_{10}$, $t_{11}$ and $t_{12}$. Subsequently, similar states are repeated on and on. Thus, it is possible to provide a ¼ frequency divider.

In the operations thus far described, the reason why there are shifts in the rise and break instants between the clock signals and the outputs $Q_4$, $\overline{Q}_4$, $Q_5$ and $Q_6$ is because there is the delay time $\tau_F$ of the flip-flop. FIG. 3B shows the construction of a conventional 2-modulus frequency divider for effecting the mode interchange between the frequency division numbers 4 and 5 similarly to FIG. 3A, but the operations thereof are similar on principle to those of FIG. 2 so that their detailed description will be omitted. Since the circuit shown in FIG. 3B is equipped with the AND gate circuit 10 for interchanging the frequency division numbers, in case the output Q of a flip-flop circuit 7-9 and the mode change signal have their levels varied from the high to low values (or vice versa), there is the delay time $\tau_A$ which can be as long as the delay time $\tau_F$ of the flip-flop circuits. Thus, the frequency $1/(\tau_F+\tau_A)$ becomes the maximum operating frequency, as has been described with regard to FIG. 2 before. On the contrary, since the frequency divider according to the present invention, as shown in FIG. 3A, requires no AND gate circuit of the kind required by FIG. 3B, the maximum operating frequency can be as high as $1/\tau_F$. Incidentally, as is apparent from the foregoing description, the flip-flop 7-6 may be that which can have its output state forcibly reduced to the zero level in response to the control signal so that there can be a variety of logic constructing methods, as will be understood.

Figure 5:
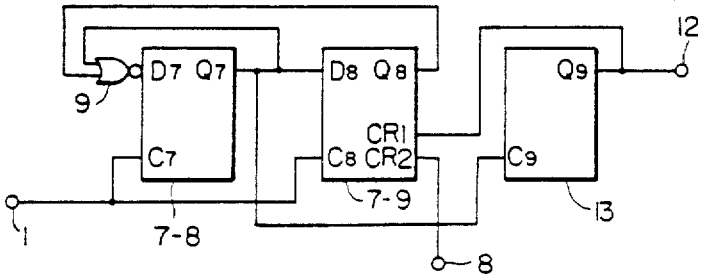
Figure 6:
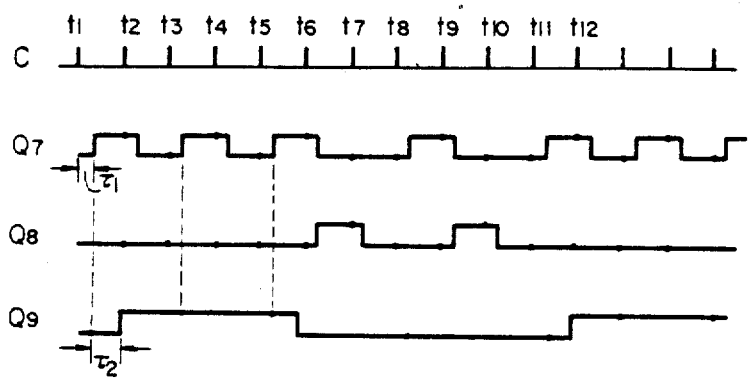

FIG. 5 is a circuit diagram showing another embodiment of the frequency divider according to the present invention. In FIG. 5, the flip-flop circuits 7-8 and 7-9 constitute a 2-modulus frequency divider, according to the present invention, which can effect ½ and ⅓ frequency divisions. This embodiment shown in FIG. 5 illustrates one example of a construction in which the aforementioned 2-modulus frequency divider formed by circuits 7-8 and 7-9 and another frequency divider 13 having a low operating speed are combined to provide a frequency divider having a larger overall frequency division number. In FIG. 5, the flip-flop circuit 7-8 constitutes the binary counter whereas the flip-flop circuit 7-9 constitutes the shift register having clear terminals $CR_1$ and $CR_2$ such that the input terminal of the aforementioned flip-flop circuit 7-8 is fed with the OR (which is constructed of the wired NOR circuit) signal of the output of the aforementioned frequency divider and the output of the shift register. The operations thereof will be explained with the use of the time chart of FIG. 6. In the present embodiment, as described hereinafter, the duty ratio of the output signal of a frequency divider 13 is set at 50%.

First of all, if all the levels of the respective output terminals $Q_7$ and $Q_8$ of the flip-flop circuits 7-8 and 7-9 and the output terminal $Q_9$ of the frequency divider 13 are all at the low state *and no mode change control signal*

*is fed to the second clear terminal* $CR_2$ [LLL], the outputs at the terminals $Q_7$, $Q_8$ and $Q_9$ are changed to the state [HLH] in response to the clock signal $t_1$.

Since the terminal $Q_8$ is cleared to the low level in response to the next clock signal $t_2$ by feeding the clear terminal $CR_1$ with the signal from the output terminal $Q_9$ of the frequency divider 13, the terminal $Q_8$ holds the low level thereby to effect the state [LLH] following clock signal $t_2$. As a result, since the flop-flop 7-9 maintains the clear state until two rises of the output at the terminal $Q_7$ come to the input terminal $C_9$ of the frequency divider, the 2-modulus frequency divider effects the toggle operation as a ½ frequency divider. Specifically, the states [LLH] and [HLH] are repeated twice. When the clock signal $t_5$ comes, the terminal $Q_7$ is changed to the high level thereby to feed the terminal C of the frequency divider 13 with the second clock signal so that the level at the terminal $Q_9$ is inverted. As a result, immediately prior to a clock signal $t_6$, the state [HLL] is reached. Thus, the state [LHL] is invited in response to the clock signal $t_6$, the state [LLL] is invited in response to a clock signal $t_7$, and the state [HLL]is invited in response to a clock signal $t_8$. Thus, the terminal C of the frequency divider 13 is fed with the high rise of the first $Q_7$ as the clock signal, but the output at the terminal $Q_9$ is left unchanged. As a result, during the clock signals $t_9$ to $t_{11}$, the outputs at the output terminals $Q_7$ and $Q_8$ are varied similarly to the manner of the clock signals $t_6$ to $t_8$. In response to the clock signal $t_{11}$, however, the level at the terminal $Q_7$ is raised to the high value thereby to feed the frequency divider 13 with the second clock so that the output terminal $Q_9$ takes the high level. As a result, during the clock signals $t_6$ to $t_{12}$, the 2-modulus frequency divider operates as the ½ frequency divider thereby to twice repeat the ⅓ frequency divisions so that the state becomes similar to that immediately prior to the application of the aforementioned clock signal $t_1$. Therefore, the states, at which the ½ and ⅓ frequency divisions are performed twice, respectively, are repeated so that the signal, which has been generated by dividing the frequency of the clock signal to be fed to the input terminal 1 into 1/10, can be generated at the output terminal 12 which is connected with the output $Q_9$ of the low speed frequency divider 13.

The foregoing description is directed to the state at which no mode change control signal is fed to the second clear terminal $CR_2$ of the shift register 7-9. When the control signal is fed to this second clear terminal $CR_2$ from the input terminal 8, the output $Q_8$ takes the low level so that the 2-modulus frequency divider becomes a ½ frequency divider which is constructed of the flip-flop circuit 7-8. As a result, a signal, which has been generated by dividing the frequency of the input clock into ⅛, can be attained at the output of the ¼ frequency divider 13.

Figure 7:
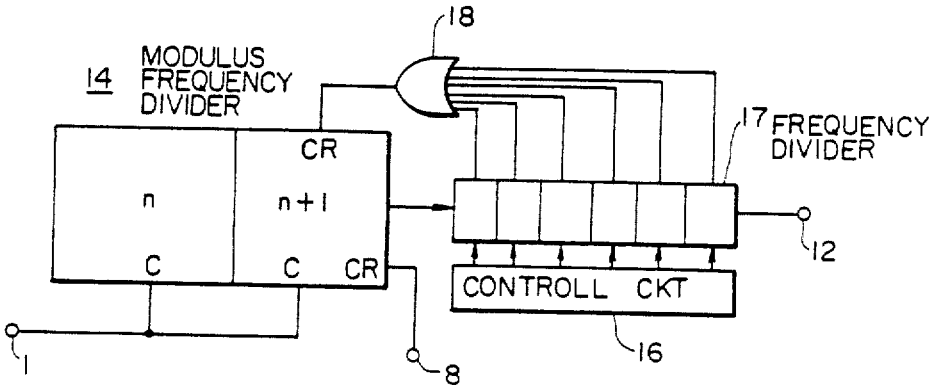

Although the embodiment shown in FIG. 5 as described above is directed to the case in which the 2-modulus frequency divider accomplishes ½ and ⅓ frequency divisions whereas the low speed frequency divider 13 accomplishes ¼ frequency division, it is generally possible to realize a frequency divider which has any desired number of frequency division and which can operate at a high speed by the construction shown in FIG. 7. In this Figure, reference numeral 14 indicates a 2-modulus frequency divider which accomplishes high speed operations at the frequency division numbers n and n+1, while numeral 17 indicates a low speed frequency divider having a frequency division number M. Numeral 16 indicates a control circuit for varying the frequency division number M of the aforementioned frequency divider 17. This frequency divider 17 is constructed by connecting flip-flop circuits in cascade such that the outputs of the respective stages are fed as the clear signal of the shift register of the aforementioned 2-modulus frequency divider through an OR circuit 18. The plural input signals of the aforementioned OR circuit are varied by the control circuit 16.

Since the output of the aforementioned frequency divider 17 takes M output states, if the frequency divider is so controlled that the m states of the M stages are at the low level whereas the remaining (M−m) stages are at the high level, the whole frequency division number N of the output terminal 12 for the signal from the input terminal 1 can be expressed by the following Equation:

$$N=n(M-m)+(n+1)m=nM+m \quad (1).$$

On the other hand, if the clear signal is supplied from the control terminal 8, the whole frequency division number N can be expressed by the following Equation:

$$N=2M \quad (2).$$

Therefore, if the aforementioned numbers M and m are suitably set, it is possible to realize a frequency divider having any desired frequency division number. As is different from the "Swallow-count" frequency divider, as shown in FIG. 1 and well known in the art, the downcounter 6 can be dispensed with. In most cases where the frequency division number of the low speed frequency divider becomes higher than 10000, the point of requiring no down-counter can be effective for reducing the cost and improving the stability of the system. The embodiment of FIG. 5 corresponds to the case of n=2, M=4 and m=2.

In the construction of FIG. 7, on the other hand, in the case of n=2 and m=1, the whole frequency division number N can be determined from the aforementioned Equations (1) and (2), as follows, respectively:

$$N=2M+1 \quad (1)';$$

and $$N=2M \quad (2)'.$$

These Equations express all of the odd and even integers so that a frequency divider having any desired frequency division number can be realized by applying the external control signal. Thus, it is remarkably feasible to design a circuit system such as the digital frequency synthesizer making use of the frequency divider of the present invention. The reduction of the number m to 1 can be easily realized by feeding the OR circuit with the outputs of the respective stages of the flip-flop circuits which are connected in cascade while constituting the frequency divider 17.

As has been basically described hereinbefore, according to the present invention, the AND function for the mode change is replaced by the clearing function of the flip-flop circuit thereby to effect the high speed. Since the delay time for determining the speed corresponds to only one stage of the flip-flop circuit, the speed can be made far higher than that of the conventional frequency divider. According to the present invention, more specifically, it is feasible to provide a high speed frequency divider which has the same speed as the frequency of the flip-flop circuit and which has, on principle, the maximum operating speed of the frequency divider constituting the flip-flop circuit. The possibility of frequency divisions of 1/10 and ⅛ up to 1 GHz has been confirmed with the use of the flip-flop circuit which is being practiced at present and which has a toggle frequency of 1 GHz.

It is to be understood that the above-described arrangements are simply illustrative of the application of the principles of this invention. Numerous other arrangements may be readily devised by those skilled in the art which embody the principles of the invention and fall within its spirit and scope.

What is claimed is:

1. A frequency divider comprising:

a counter constructed of one or more flip-flop circuits;

a shift register including an input terminal connected with an output terminal of said counter, an output terminal for providing a shift register output signal and a clear terminal responsive to a predetermined external control signal for varying the number of the frequency division of the frequency divider by forcing the shift register output signal at the output terminal to a zero condition; and a feedback circuit for feeding an input terminal of the flip-flop circuit at the first stage of said counter with an OR signal comprised of the output of said counter and the output signal of said shift register.

2. A frequency divider as set forth in claim 1, wherein said feedback circuit is constructed of a wired logic circuit having two input terminals to which said output signal of said counter and said output signal of said register are applied, and an output terminal connected to said input terminal of the flip-flop circuit at the first stage of said counter.

3. A frequency divider as set forth in claim 1, wherein said shift register includes a flip-flop circuit.

4. A frequency divider as set forth in claim 1, wherein said counter includes: a first flip-flop circuit; a second flip-flop circuit coupled to a not-output signal of said first flip-flop circuit; an input terminal for commonly feeding clock terminals of the respective flip-flop circuits with an input signal; and an output terminal for extracting the not-output signal of said first flip-flop circuit as a frequency divided output.

5. A frequency divider as set forth in claim 4, wherein the division ratio of the frequency divider is 1/6 when the external control signal is not applied and 1/5 when the external control signal is applied.

[6. A frequency divider as set forth in claim 1, wherein said counter includes a single flip-flop circuit, and wherein said feedback circuit includes a NOR circuit, whereby the input terminal of said single flip-flop is commonly fed to respective clock terminals of said flip-flop circuit and said shift register thereby to interchange the division ratio between 1/2 and 1/3.]

7. A frequency divider as set forth in claim 1, wherein the flip-flop circuits of the counter are D-type flip-flop circuits.

8. A frequency divider as set forth in claim 1, wherein said output terminal *of the shift register* is held in said zero condition for as long as said predetermined external control signal is applied to said clear terminal.

9. A frequency divider as set forth in claim 1, wherein said feedback circuit is comprised of a single wired OR gate having a much smaller delay time than a delay time $\tau_F$ of said flip-flop circuit so that a maximum operating frequency of said frequency divider is $1/\tau_F$.

10. A frequency divider comprising:

a first counter including a binary counter including one or more flip-flop circuits;

a shift register including an input terminal connected with an output terminal of said first counter, a clear terminal for effecting the clearing operation of the shift register in response to an external control signal for varying the frequency division number, and an output terminal for providing a shift register output signal;

[a logic circuit] *a first feedback circuit* for feeding an input terminal of the flip-flop circuit at the first stage of said first counter with [an OR signal] *a logical operation signal* of the output of said first counter and the output signal of said shift register;

a second counter including one or more flip-flop circuits coupled to the output of said first counter for further dividing the frequency of the output of said first counter; and a *second* feedback circuit for applying at least one portion of the output of the flip-flop circuits constituting said second counter, as a clear signal, to said shift register.

11. A frequency divider as set forth in claim 10, [wherein said first counter includes a 2-modulus frequency divider for interchanging the frequency division number between n and n+1 (wherein n is an integer), and] wherein said *second* feedback circuit includes an OR circuit made receptive of all the outputs of a plurality of flip-flop circuits constituting said second counter.

12. A frequency divider as set forth in claim [6] *10*, wherein the flip-flop circuits of the first counter are D-type flip-flops and the flip-flop circuits of the second counter are toggled flip-flops which produce a change in state of their output for every other input signal applied to their input terminals.

13. A frequency divider as set forth in claim 10, wherein the frequency division ratio at the output of the second counter is 1/10 when the external control signal is not applied to the shift register clear terminal and ⅛ when the external control signal is applied to the shift register clear terminal.

14. A frequency divider as set forth in claim 10, wherein [the logic circuit] *the first feedback circuit* comprises a NOR gate.

15. A frequency divider comprising:

a counter constructed of one or more flip-flop circuits;

a shift register including an input terminal connected with an output terminal of said counter, an output terminal for providing a shift register output signal and a clear terminal responsive to a predetermined external control signal for varying the number of the frequency division of the frequency divider by forcing the shift register output signal at the output terminal to a zero condition; and a feedback circuit for feeding an input terminal of the flip-flop circuit at the first stage of said counter with a NOR signal of the output of said counter and the output signal of said shift register.

16. A frequency divider as set forth in claim 15, wherein said output terminal is held in said zero condition for as long as said predetermined external control signal is applied to said clear terminal.

17. A frequency divider as set forth in claim 15, wherein said feedback circuit is comprised of a single wired NOR gate having a much smaller delay time than a delay time $\tau_F$ of said flip-flop circuit so that a maximum operating frequency of said frequency divider is $1/\tau_F$.

18. A frequency divider as set forth in claim 15, wherein said feedback circuit is constructed of a wired logic circuit having two input terinals to which said output signal of said counter and said output signal of said register are applied, and an output terminal connected to said input terminal of the flip-flop circuit at the first stage of said counter.

*19. A frequency divider as set forth in claim 4, wherein the division ratio of the frequency divider is 1/5 when the external control signal is not applied and ¼ when the external control signal is applied.*

*20. A frequency divider comprising:*

*a counter means for counting an input signal;*

*a shift register means for generating an output signal, wherein said output signal is a first signal produced from shifting an output of said counter means when an external control signal is not applied to said shift register means and a second signal produced from clearing an output of said counter means when an external control signal is applied to said shift register; and*

*a feedback circuit means for feeding said counter means with a logical operation signal of the output signal of said counter means and the output signal of said shift register means.*

*21. A frequency divider as set forth in claim 20, wherein said counter means includes one or more flip-flop circuits.*

*22. A frequency divider as set forth in claim 20, wherein said feedback circuit means includes a wired logic circuit.*

*23. A frequency divider as set forth in claim 20, wherein said shift register means includes a flip-flop circuit.*

*24. A frequency divider as set forth in claim 20, wherein said counter means includes a first flip-flop circuit, and a second flip-flop circuit coupled to a not-output signal of said first flip-flop circuit as a frequency divided output.*

*25. A frequency divider as set forth in claim 20, wherein said feedback circuit means includes an OR circuit.*

*26. A frequency divider comprising:*

*a first counter means for counting an input signal;*

*a second counter means for dividing the frequency of the output signal of said first counter means;*

*a shift register means for generating an output signal, wherein said output signal is a first signal produced from shifting an output of said first counter means when a clear signal including an external control signal and an output signal of said second counter means is not applied to said shift register means and a second signal produced from clearing an output of a first counter means when said clear signal including at least one of an external control signal and an output signal of said second counter means is applied to said shift register; and*

*a feedback circuit means for feeding said first counter means with a logical operation signal of the output signal of said first counter means and the output signal of said shift register means.*

*27. A frequency divider as set forth in claim 26, wherein said second counter means includes one or more flip-flop circuits.*

*28. A frequency divider as set forth in claim 26, wherein said first counter means includes one or more flip-flop circuits.*

*29. A frequency divider as set forth in claim 26, wherein said feedback circuit means includes a NOR circuit.*

*30. A frequency divider as set forth in claim 26, wherein said feedback circuit means a wired logic circuit.*

*31. A frequency divider comprising:*

*a counter having one or more flip-flop circuits;*

*a shift register coupled to said counter, having input means for deriving an input signal from said counter, output means for providing a shift register output signal and clear means responsive to a predetermined external control signal for varying the number of the frequency division of the frequency divider by forcing the shift register output signal to the logic value zero; and*

*a feedback circuit coupled to said counter and shift register, for feeding said counter with a logical operation signal comprised of the output of said counter and the output of said shift register.*

* * * * *